United States Patent
Zhou

(10) Patent No.: US 7,050,922 B1
(45) Date of Patent: May 23, 2006

(54) METHOD FOR OPTIMIZING TEST ORDER, AND MACHINE-READABLE MEDIA STORING SEQUENCES OF INSTRUCTIONS TO PERFORM SAME

(75) Inventor: Zhengrong Zhou, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/036,574

(22) Filed: Jan. 14, 2005

(51) Int. Cl.
*G06F 15/20* (2006.01)

(52) U.S. Cl. ........................ 702/120; 702/81; 702/181; 702/182; 702/183; 700/109; 700/110; 700/121; 438/14; 438/15

(58) Field of Classification Search .................... None
See application file for complete search history.

(56) References Cited

U.S. PATENT DOCUMENTS

| 5,922,079 | A | * | 7/1999 | Booth et al. .................. 714/26 |
| 6,078,189 | A | * | 6/2000 | Noel .......................... 324/765 |
| 6,167,352 | A | * | 12/2000 | Kanevsky et al. ............ 702/81 |
| 6,959,252 | B1 | * | 10/2005 | Tai et al. ....................... 702/84 |
| 2005/0066298 | A1 | * | 3/2005 | Visweswariah ................ 716/6 |
| 2005/0210311 | A1 | * | 9/2005 | Rodeheffer ...................... 714/1 |
| 2005/0217349 | A1 | * | 10/2005 | Stremler et al. ........... 73/53.05 |

\* cited by examiner

*Primary Examiner*—Carol S. W. Tsai

(57) ABSTRACT

In a test order optimization method, a pass probability and resource requirement are identified for each of a plurality of tests. A pass-weighted resource requirement factor is then generated for each of the tests in accord with the test's pass probability and resource requirement. Thereafter, the tests are ordered to be executed in accord with their pass-weighted resource requirement factors.

19 Claims, 3 Drawing Sheets

METHOD FOR OPTIMIZING TEST ORDER, AND MACHINE-READABLE MEDIA STORING SEQUENCES OF INSTRUCTIONS TO PERFORM SAME

BACKGROUND

Prior to the manufacture and/or distribution of a product such as an electrical or mechanical device (including a system or component such as a circuit board, integrated circuit, or system-on-a-chip (SOC)), or a software program or module, the product is typically tested to determine whether it is built or functions as designed. Product testing has become a significant overhead item in many industries, requiring time, equipment, personnel, and other resources.

SUMMARY OF THE INVENTION

In one embodiment, a test order optimization method comprises identifying a pass probability and resource requirement for each of a plurality of tests. A pass-weighted resource requirement factor is then generated for each of the tests in accord with the test's pass probability and resource requirement. Thereafter, the tests are ordered to be executed in accord with their pass-weighted resource requirement factors.

Other embodiments are also disclosed.

BRIEF DESCRIPTION OF THE DRAWINGS

Illustrative embodiments of the invention are illustrated in the drawings, in which.

DETAILED DESCRIPTION

During product testing, tests are often performed in some sort of logical order. For example, tests may be performed on one block or module of the product, then another block or module. Or, for example, all of one type of test may be performed, then all of another type of test. When a test fails, the execution of additional tests is typically halted, and the product is either destroyed or reworked.

Figure 1:
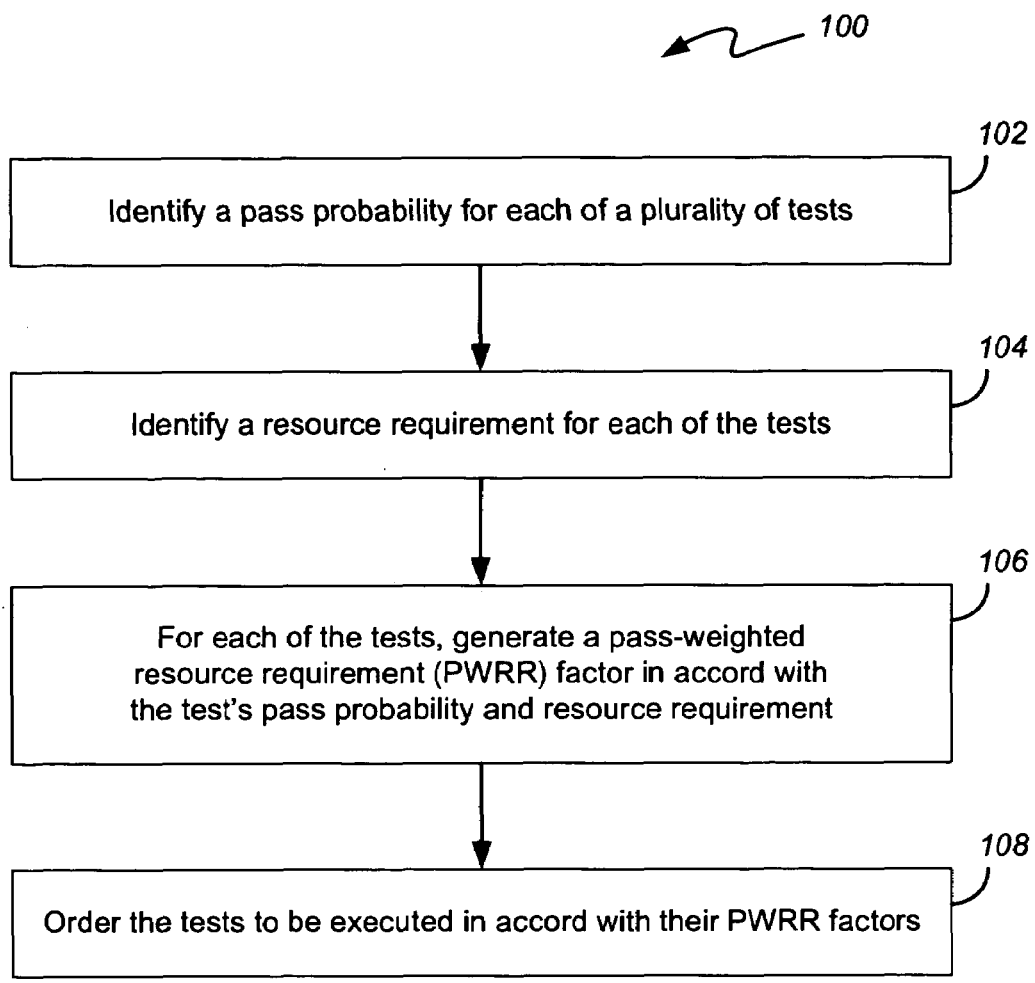
FIG. 1 illustrates an exemplary test order optimization method.

FIG. 1 illustrates an exemplary test order optimization method 100. In some cases, the method may optimize test order to enable the identification of failed products more quickly, thereby enabling an increase in product throughput during product testing. The method 100 comprises identifying 102, 104 a pass probability and resource requirement for each of a plurality of tests. A pass-weighted resource requirement factor is then generated for each of the tests in accord with the test's pass probability and resource requirement. Thereafter, the tests are ordered to be executed in accord with their pass-weighted resource requirement factors.

Before a test is executed, its pass probability may be unknown. In such a case, the test's probability may be estimated (or an already estimated pass probability may be identified). After a test has been executed one or more times, its pass probability may be determined from its prior executions. In some cases, a test's pass probability may be periodically updated. For example, pass probabilities may be updated after the test of every 1000 products, or after every 24 hours of testing. Updated pass probabilities may then be used to re-generate PWRR factors and re-order test execution accordingly.

A test's resource requirement may variously comprise, for example, the test's execution time, the test's cost, the test's equipment (hardware or software) needs, and in some cases, the test's personnel requirements.

A test's pass-weighted resource requirement (PWRR) factor may be generated in various ways. In a preferred embodiment, the factor is generated by multiplying a test's pass probability and resource requirement. Alternately, the factor may be generated by adding or otherwise combining a test's pass probability and resource requirement. In one embodiment, PWRR factors are generated so as to provide indications of which tests are likely to fail more often, using fewer test resources. In this manner, these tests may be placed earlier in a test execution order, thereby increasing the likelihood that a failed product will be identified more quickly so that additional tests on the failed product can be skipped and product throughput during product testing can be increased. However, in other embodiments, it might be desirable to use PWRR factors to place tests in a different order.

In some cases, it may be desirable to generate a PWRR factor by combining a test's pass probability and resource requirement in accord with a non-linear formula. For example, a test's pass probability and resource requirement may be combined in one way if the test's pass probability or resource requirement is within a first range, but combined in a different way if the test's pass probability or resource requirement is within a second range (e.g., consider a human technician that has a relatively modest pay rate, but at a certain number of hours worked is entitled to overtime pay; or, consider a test that requires additional computer processing capability that can only be achieved at a premium rental rate). It may also be desirable to cap a PWRR factor at a certain value.

In one embodiment of the method 100, some or all PWRR factors may also be generated in accord with an adjustment factor. For example, in some cases, different tests may be associated with different adjustment factors to reflect the differing importance of certain tests, thereby causing critical tests to be moved higher in test execution order.

A PWRR adjustment factor may also be useful in cases where different resource requirements are identified for different tests. In this case, the adjustment factor can be used to equate the different resource requirements. For example, a test that takes 3 seconds to perform may be deemed equivalent to another test costing $15.00. For simplicity, assume each test has a 10% pass potential. The first test would have a PWRR factor of 0.3 (3 seconds×10% pass), while the second test would have a PWRR factor of 1.5 ($15.00×10% pass). As these pass-weighted resource requirement factors have been determined to be equivalent, multiplying the first PWRR factor by an adjustment factor of 5 (or multiplying the second PWRR factor by an adjustment factor of ⅕) provides a means to equate the two resource requirements.

Figure 2:
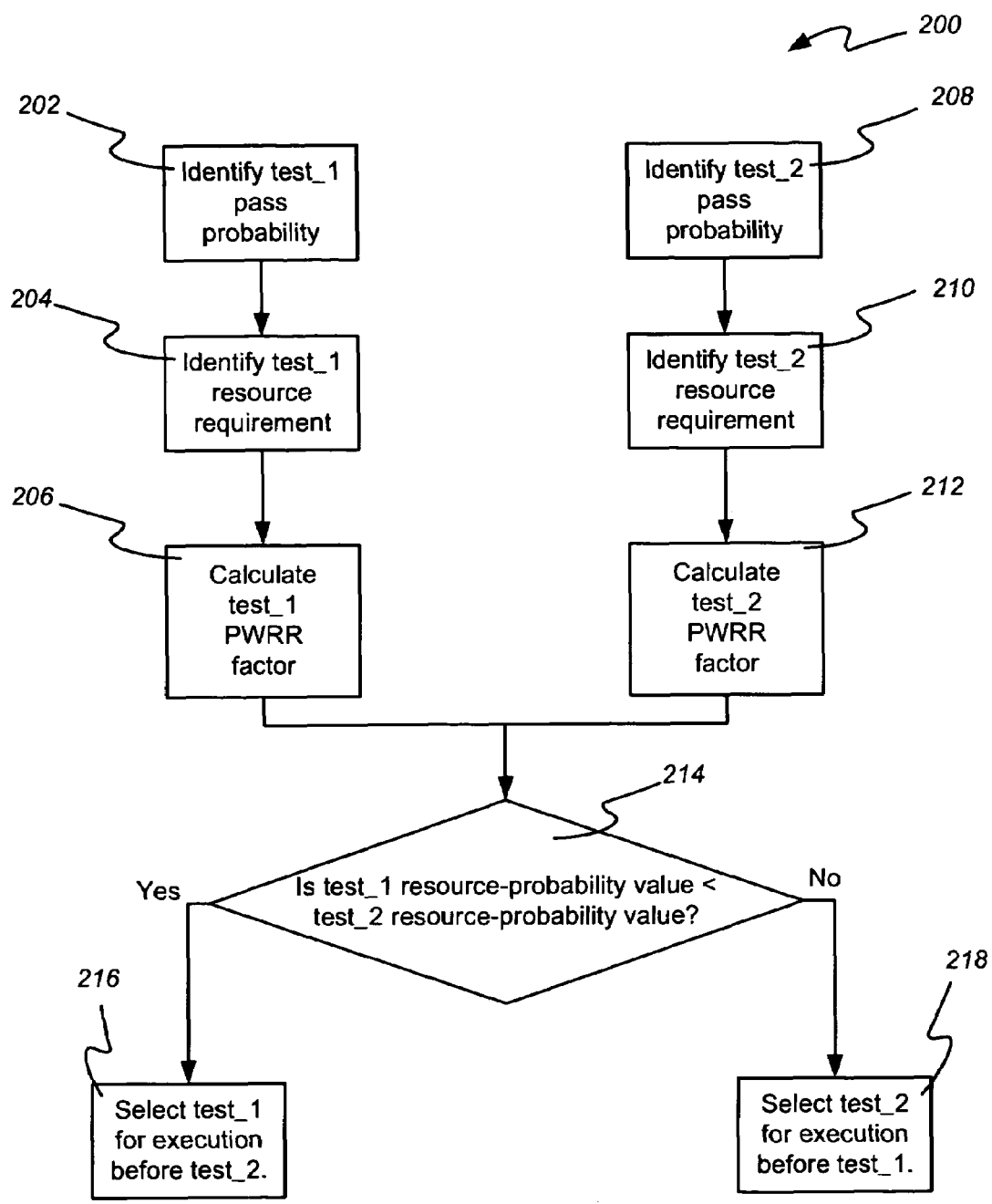
FIG. 2 illustrates an exemplary use of the FIG. 1 method to order two tests.

FIG. 2 illustrates an exemplary use of the method 100 to determine 214 which of two tests should be selected for execution before the other. As shown, the pass probabilities are determined 202, 208 for test_1 and test_2. The resource requirements are also determined 204, 210 for test_1 and test_2. Thereafter, PWRR factors are calculated 206, 212 for test_1 and test_2; and the PWRR factors are used to determine 214 whether test_1 should be selected 216 for execution before test_2, or whether test_2 should be selected 218 for execution before test_1.

Note that if two tests have the same pass probability, they will be ordered in accord with their resource requirements. Likewise, if two tests have the same resource requirements, they will be ordered in accord with their pass probability.

Figure 3:
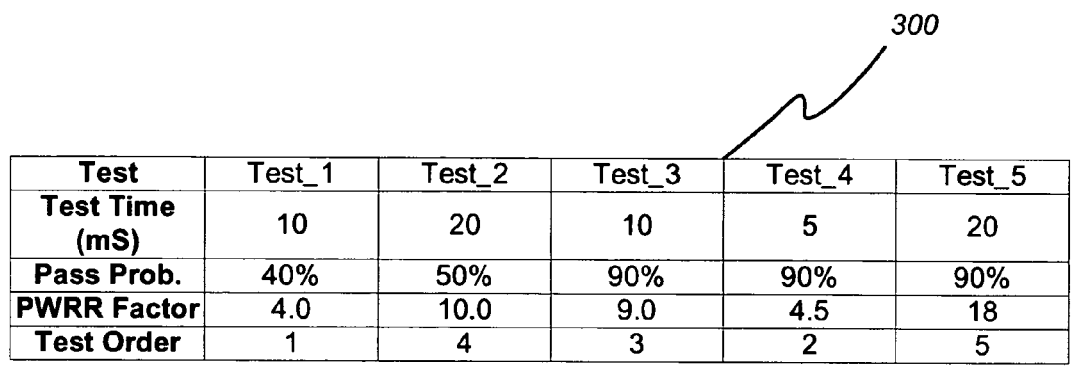
FIG. 3 illustrates an exemplary table of tests, ordered in accord with the FIG. 1 method.

FIG. 3 illustrates an exemplary table 300 of five tests and their respective resource requirements, pass probabilities, PWRR factors, and selected performance order. Here, the PWRR factors are derived from multiplying test times by pass probabilities. The tests are ordered to be executed in accord with low-to-high PWRR factors, as illustrated.

In one embodiment, the method shown in FIG. 1, or any variant thereof, may be embodied in sequences of instructions stored on machine-readable media (e.g., one or more fixed disks, removable media such as compact discs (CDs) or digital versatile discs (DVDs), random-access or read only memories, or any combination thereof, whether in a single location, on a single machine, or distributed across a network). When executed by a machine such as a computer system, the sequences of instructions then cause the machine to perform the actions of the method 100. By way of example, the machine which executes the sequences of instructions may be a system-on-a-chip (SOC) tester, such as the Agilent 93000 SOC Tester (available from Agilent Technologies, Inc., which is headquartered in Palo Alto, Calif., USA). SOC testing often requires the execution of large numbers of circuit tests and, as a result, effectively and efficiently identifying failed SOCs can save a significant amount of time and/or other resources, as well as improve product throughput during SOC testing.

What is claimed is:

1. A test order optimization method, comprising:
identifying a pass probability for each of a plurality of tests;
identifying a resource requirement for each of the tests;
for each of the tests, generating a pass-weighted resource requirement factor in accord with the test's pass probability and resource requirement; and
ordering the tests to be executed in accord with their pass-weighted resource requirement factors.

2. The method of claim 1, wherein identifying pass probabilities for the tests comprises, for at least one test, estimating a pass probability of the test before the test is executed.

3. The method of claim 1, wherein identifying pass probabilities for the tests comprises, for at least one test, determining a pass probability of the test from prior executions of the test.

4. The method of claim 1, wherein identifying resource requirements for the tests comprises, for at least one test, identifying a time requirement necessary to execute the test.

5. The method of claim 1, wherein generating pass-weighted resource requirement factors for the tests comprises, for at least one test, multiplying the test's pass probability and resource requirement.

6. The method of claim 1, wherein generating pass-weighted resource requirement factors for the tests comprises, for at least one test, adding the test's pass probability and resource requirement.

7. The method of claim 1, wherein, for at least one test, the test's pass-weighted resource requirement factor is further generated in accord with an adjustment factor.

8. The method of claim 7, wherein the adjustment factor for a test reflects the importance of the test.

9. The method of claim 1, wherein different resource requirements are identified for different tests, and wherein, for at least one test, the test's pass-weighted resource requirement factor is further generated in accord with an adjustment factor that equates its resource requirement with a different resource requirement.

10. The method of claim 1, wherein generating pass-weighted resource requirement factors for the tests comprises, for at least one test, generating its pass-weighted resource requirement in accord with a non-linear formula.

11. The method of claim 1, wherein ordering the tests comprises placing tests with lower pass-weighted resource requirement factors for execution before tests with higher pass-weighted resource requirement factors.

12. The method of claim 1, further comprising, periodically,
updating at least the pass probabilities for the tests;
re-generating the pass-weighted resource requirement factors for the tests; and
re-ordering the tests to be executed in accord with their re-generated pass-weighted resource requirement factors.

13. The method of claim 1, wherein the tests are circuit tests.

14. A number of machine-readable media having stored thereon sequences of instructions that, when executed by a machine, cause the machine to perform the actions of:
identifying a pass probability for each of a plurality of tests;
identifying a resource requirement for each of the tests;
for each of the tests, generating a pass-weighted resource requirement factor in accord with the test's pass probability and resource requirement; and
ordering the tests to be executed in accord with their pass-weighted resource requirement factors.

15. The machine-readable media of claim 14, wherein the instructions that cause the machine to perform the action of identifying resource requirements for the tests cause the machine to, for at least one test, identify a time requirement necessary to execute the test.

16. The machine-readable media of claim 14, wherein the instructions that cause the machine to perform the action of generating pass-weighted resource requirement factors for the tests cause the machine to, for at least one test, multiply the test's pass probability and resource requirement.

17. The machine-readable media of claim 14, wherein the instructions that cause the machine to perform the action of generating pass-weighted resource requirement factors for the tests cause the machine to, for at least one test, further generate the test's pass-weighted resource requirement factor in accord with an adjustment factor.

18. The machine-readable media of claim 17, wherein the adjustment factor for a test reflects the importance of the test.

19. The machine-readable media of claim 14, wherein the instructions further cause the machine to, periodically,
update at least the pass probabilities for the tests;
re-generate the pass-weighted resource requirement factors for the tests; and
re-order the tests to be executed in accord with their re-generated pass-weighted resource requirement factors.

* * * * *